United States Patent [19]

Kling et al.

[11] Patent Number: 4,908,586
[45] Date of Patent: Mar. 13, 1990

[54] COMPACT ENCAPSULATED FILTER ASSEMBLY FOR PRINTED CIRCUIT BOARDS AND METHOD OF MANUFACTURE THEREOF

[75] Inventors: John P. Kling, Mt. Joy; Richard F. Stone Jr., Elizabethtown, both of Pa.

[73] Assignee: AMP Incorporated, Harrisburg, Pa.

[21] Appl. No.: 103,094

[22] Filed: Sep. 30, 1987

[51] Int. Cl.$^4$ .............................................. H03H 7/01
[52] U.S. Cl. ..................................... 333/182; 333/185; 361/400
[58] Field of Search .......... 333/167, 168, 12, 175–177, 333/181–182, 185, 183–184, 174; 361/400, 404, 405, 407, 408, 417

[56] References Cited

U.S. PATENT DOCUMENTS

| Re. 029,258 | 6/1977 | Fritz ..................................... 333/182 |
| 2,244,009 | 6/1941 | Hiensch et al. .................. 361/400 X |
| 3,725,825 | 4/1973 | Hudson Jr. .......................... 333/182 |
| 3,939,444 | 2/1976 | Hollyday et al. ..................... 333/182 |
| 3,991,347 | 11/1976 | Hollyday ............................. 361/400 |
| 4,320,364 | 3/1982 | Sakamoto et al. ............. 333/185 X |
| 4,374,369 | 2/1983 | Sakamoto et al. ............. 333/185 X |
| 4,553,114 | 11/1985 | English et al. ....................... 333/182 |
| 4,563,659 | 1/1986 | Sakamoto ....................... 333/185 X |
| 4,695,105 | 9/1987 | Ney et al. ............................ 439/95 |

FOREIGN PATENT DOCUMENTS

| 3634159 | 4/1987 | Fed. Rep. of Germany . |
| 59-160718 | 1/1984 | Japan . |
| 59-218912 | 4/1984 | Japan . |
| 0085616 | 5/1985 | Japan ................................... 333/181 |

OTHER PUBLICATIONS

AMP Shielded & Filtered Products for EMC 82-68-3-issued 5/83.
AMP Quiet Line Filter Products 78-487, Revised 11-86.

Primary Examiner—Eugene R. Laroche
Assistant Examiner—Seung Ham
Attorney, Agent, or Firm—Katherine A. Nelson

[57] ABSTRACT

An improved filter assembly (10) for filtering RFI/EMI in printed circuit boards is disclosed, together with methods of manufacture thereof. A filter sleeve (16) is carried by an outer leg (11) of the filter assembly and is substantially parallel to the respective legs (11, 12, 13) thereof, thereby providing a compact structure for improved circuit miniaturization. The filter assemblies are encapsulated with a suitable insulating material (17). The respective filter assemblies (10) are made in a continuous strip, suitably stamped, and broken off as desired by the user. In a further embodiment, the respective filter assemblies are made from a continuous wire, suitably bent and formed, and cut off as desired.

12 Claims, 7 Drawing Sheets

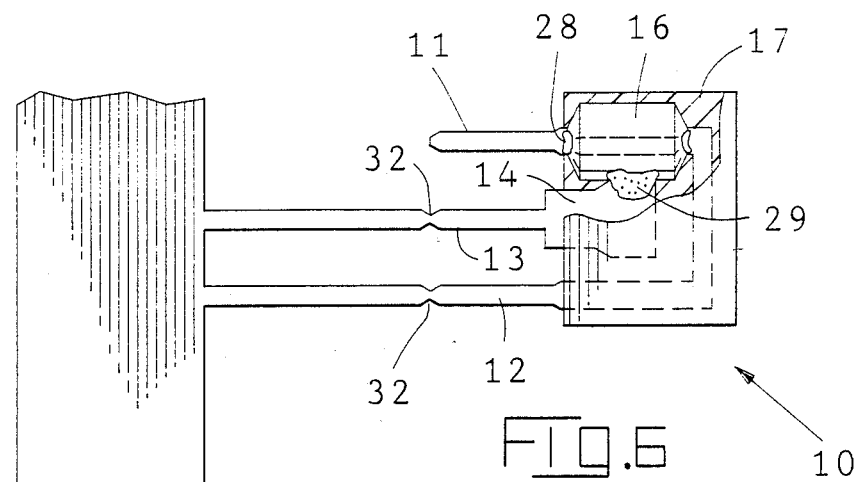
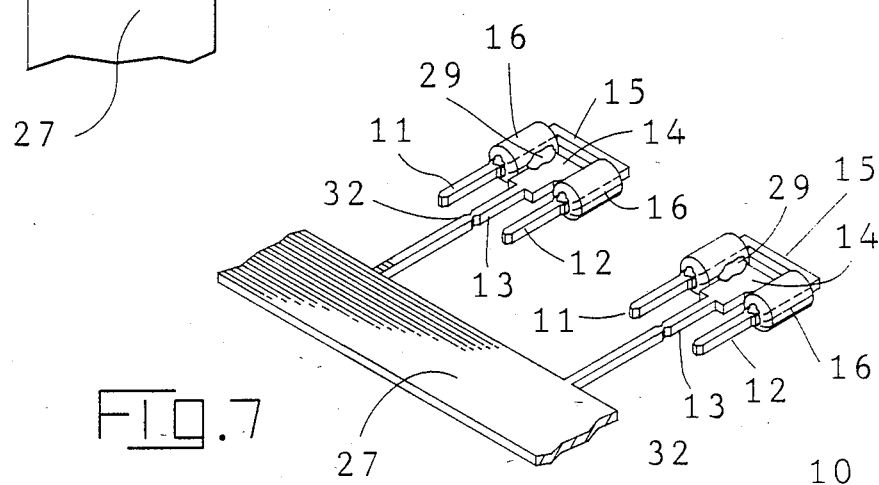
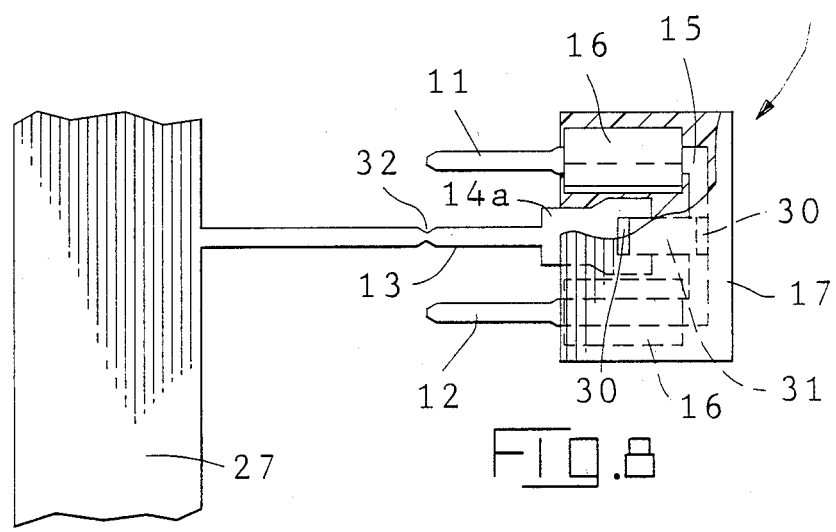

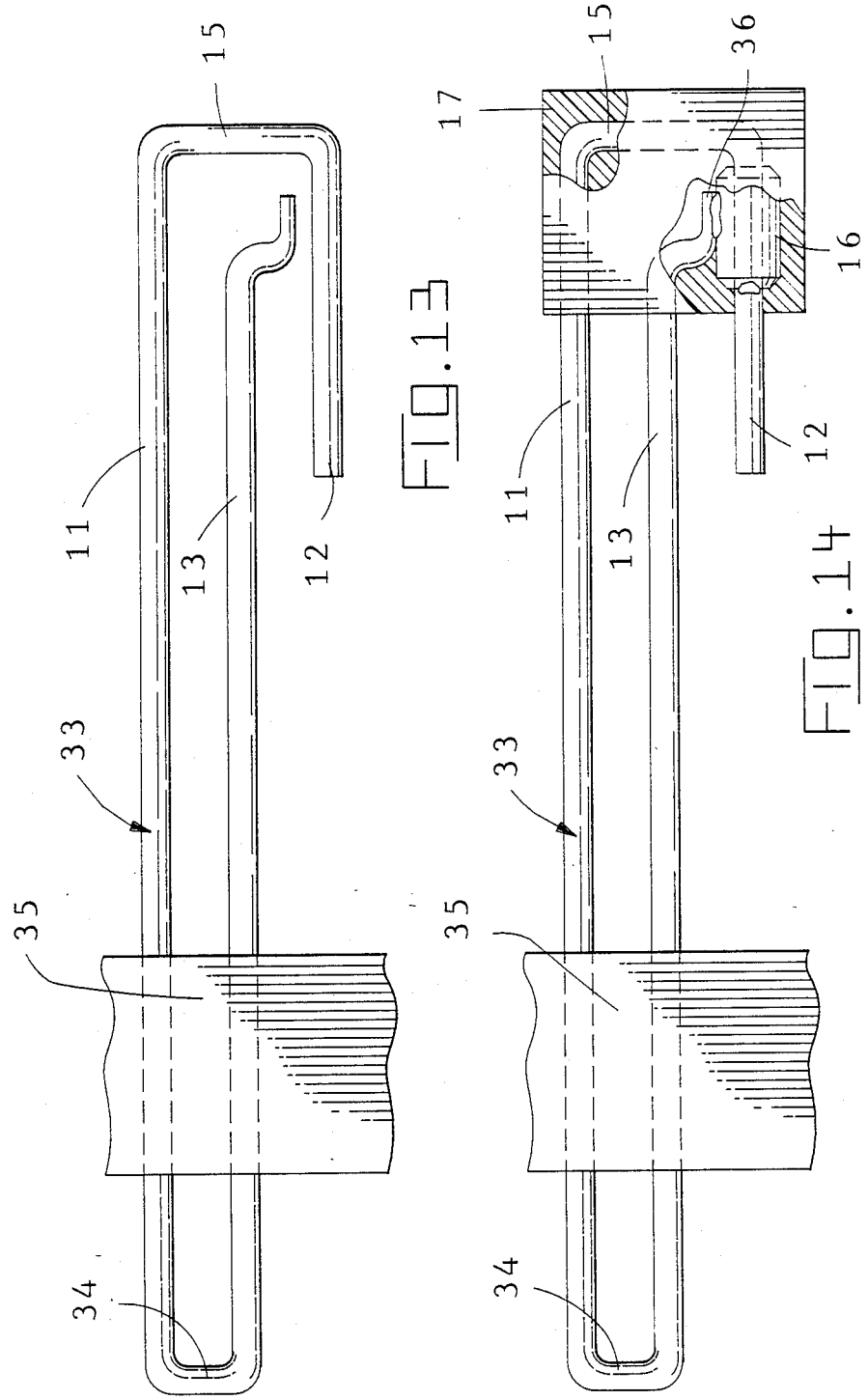

4,908,586

COMPACT ENCAPSULATED FILTER ASSEMBLY FOR PRINTED CIRCUIT BOARDS AND METHOD OF MANUFACTURE THEREOF

FIELD OF THE INVENTION

The present invention relates to a filter assembly intended for printed circuit boards, and more particularly, to a compact encapsulated filter assembly and to methods of manufacture thereof.

BACKGROUND OF THE INVENTION

Filters are employed in electronic equipment, such as computers, for filtering out radio frequency interference ("RFI") or electromagnetic interference ("EMI") thereby precluding spurious operation of the electronic equipment due to the external influences exerted by other mechanical or electrical equipment in the environment of the electronic equipment.

For example, the filter may comprise a cylindrical sleeve, such as an extruded tube of ferrite coated with barium titanate, as described and claimed in U.S. Pat. No. Re. 29,258 (assigned to the assignee of the present invention). The filter sleeve may be encapsulated in a filter assembly intended for use in printed circuit ("PC") boards, such as that described and claimed in U.S. Pat. No. 4,553,114 (also assigned to the assignee of the present invention). In this '114 patent, a through conductor or wire is slidably received within the bore of the filter sleeve, and the eyelet portion of a ground pin is received over the filter sleeve. Thereafter, the filter sleeve is soldered or otherwise suitably secured to the conductor and to the eyelet portion of the ground pin, respectively, for mechanical and electrical engagement therewith. The respective ends of the through conductor are bent downwardly at right angles thereto, substantially in parallel with the depending ground pin, so as to form three legs of the filter assembly. The eyelet of the ground pin, together with the filter sleeve and the respective adjacent portions of the through conductor, are thereafter encapsulated with a suitable insulating means.

While perfectly suitable for the purposes intended, nevertheless the filter assembly described and claimed in the aforesaid '114 patent does not readily lend itself to automated production, nor are the respective filter assemblies conveniently carried on a continuous strip.

Additionally, the filter sleeve in the '114 patent is disposed substantially at right angles to the ground pin and to the respective downwardly-bent outer legs of the filter assembly. With this arrangement, the length of the filter assembly is essentially controlled by the distance between the respective outer legs thereof, which constitutes the limiting dimension or factor, and thus further improvements in compactness are necessarily constrained due to the structural arrangement of the respective components of the overall filter assembly.

SUMMARY OF THE INVENTION

Accordingly, it is an object of the present invention to provide an improved filter assembly which readily facilitates the automated production and assembly thereof, thereby substantially reducing overall manufacturing costs.

It is another object of the present invention to provide a series of respective filter assemblies carried on a continuous strip, such that a particular filter assembly may be broken off (or cut off) from the strip, as needed.

It is yet another object of the present invention to provide a filter assembly, suitable for use in printed circuit boards, which is substantially more compact than the filter assemblies heretofore resorted to in the prior art, thereby providing the circuit designer with added flexibility, facilitating equipment miniaturization, and further reducing overall costs.

In accordance with the teachings of the present invention, a preferred embodiment thereof is herein illustrated and described, comprising a filter assembly for providing RFI/EMI filtering on a printed circuit board. This filter assembly has three legs disposed substantially parallel to each other and including a first outer leg, a second outer leg, and a central leg disposed between the first and second outer legs. The outer legs constitute the respective conductors of the filter assembly, and the central leg constitutes a ground pin of the filter assembly. A substantially cylindrical filter sleeve is received over one of the outer legs, such that the filter sleeve is disposed substantially parallel to the legs of the filter assembly, and such that the distance between the respective outer legs is substantially reduced, thereby providing a filter assembly which is substantially more compact. Means are provided for securing the filter sleeve to the one outer leg and to the central leg, respectively, in mechanical and electrical engagement therewith; and insulating means are provided for encapsulating the filter sleeve and respective portions of the legs.

Preferably, the assembly includes a bight portion between the first and second outer legs, the bight portion being encapsulated within the insulating means; and the filter sleeve is soldered to the one leg and to the central leg, respectively.

In accordance with the further teachings of the present invention, there is herein illustrated and described, an improved method of making a strip of respective filter assemblies which includes the step of providing a ribbon of metal, and blanking out the ribbon to form a plurality of respective spaced-apart filter assembly segments. Each segment includes a pair of substantially-parallel outer legs, a bight portion connecting the respective outer legs, such that the respective outer legs comprise the conductors of the filter assembly, and a central ground leg disposed between the respective outer legs and substantially parallel thereto. A filter sleeve is provided and is slidably received over one of the outer legs to a position substantially adjacent to the bight portion, such that the filter sleeve is substantially parallel to the respective legs. The filter sleeve is secured in mechanical and electrical engagement with the one outer leg and with the central ground leg; and the filter sleeve, bight portion, and respective portions of the legs are encapsulated with an insulating means.

Preferably, the distance between the outer leg and the central ground leg should be essentially equal to the radius of the filter sleeve that is to be mounted to the outside leg. This distance is preferably controlled, where necessary, by providing a flat blade-like portion formed on the end of the ground leg nearer the bight portion. Preferably the blade portion extends downwardly along the leg beyond the leg portion that is encapsulated, thus providing a standoff for the filter assembly. The filter sleeve may be secured to the legs with solder, conductive epoxy, or other suitable means. It is to be understood that the word "solder" as used hereinafter will include all such suitable means. It is to be further understood that mechanical pressure may also be used to secure and electrically engage the respective elements of the assembly.

In a preferred embodiment, the ribbon provides a carrier strip for the respective filter assembly segments, wherein the one outer leg is separated from the carrier strip, and wherein the other outer leg and the central ground leg are integrally connected to the carrier strip. Notches are formed on the other outer leg and on the central ground leg, respectively, intermediately of the carrier strip and the encapsulating insulating means. With this arrangement, the respective filter assembly segments may be broken off from the strip, as desired.

In another embodiment, a filter sleeve is carried by each of the outer legs and is soldered to the enlarged blade of the inner ground leg, thus providing what is known in the art as a cascaded filter assembly.

In a further embodiment of the invention, ferrite beads are disposed on each of the outer legs and a capacitor is disposed between the enlarged blade portion of the ground leg and the bight portion of the filter assembly to form a "T" filter.

In an alternate embodiment, a continuous wire is bent to form the plurality of respective spaced-apart filter assembly segments. Preferably, a tang is formed on the central ground leg, substantially parallel to the one outer leg and offset therefrom. When the filter sleeve is slidably received on the one outer leg, the outer cylindrical surface of the filter sleeve is soldered to the offset tang on the central ground leg.

Viewed in another aspect, the present invention provides an improved filter assembly intended for providing RFI/EMI filtering on a printed circuit board, wherein the filter assembly has three parallel legs including respective outer conductive legs and an inner ground leg. The improvement includes a filter sleeve carried by one of the outer conductive legs and disposed substantially parallel to the legs, respectively. The filter sleeve is secured to the one outer conductive leg and to the inner ground leg in substantial mechanical and electrical engagement therewith, respectively, such that the distance between the respective outer legs is substantially reduced, thereby providing a substantially more compact filter assembly. An insulating means encapsulates the filter sleeve and respective portions of the legs. The filter sleeve is soldered to the one outer leg and to the inner ground leg, respectively; and preferably, the inner ground leg has an enlarged blade portion soldered to the filter sleeve.

These and other objects of the present invention will become apparent from a reading of the following specification, taken in conjunction with the enclosed drawings.

BRIEF DESCRIPTION OF THE DRAWINGS

FIG. 6 is a top plan view of one of the filter assemblies, drawn to an enlarged scale, and with certain parts broken away and sectioned.

FIG. 7 corresponds substantially to that of FIG. 4, but shows two filter sleeves carried in cascade by the respective outer legs of the filter assembly.

FIG. 8 is a top plan view of a T-filter configuration, drawn to an enlarged scale and with certain parts broken away and sectioned, and showing ferrite beads disposed on the outer legs of the assembly and a capacitor disposed between the bight portion and a recess in the blade portion of the inner ground leg.

FIG. 13 is a top plan view of a still further embodiment of the method of manufacturing the improved filter assembly of the present invention, wherein a continuous bent wire is used.

FIG. 14 corresponds substantially to that of FIG. 11, but shows the securing of the filter sleeve therein, and further showing the encapsulation of the filter assembly.

GENERAL DESCRIPTION OF THE PREFERRED EMBODIMENTS

Figure 1:
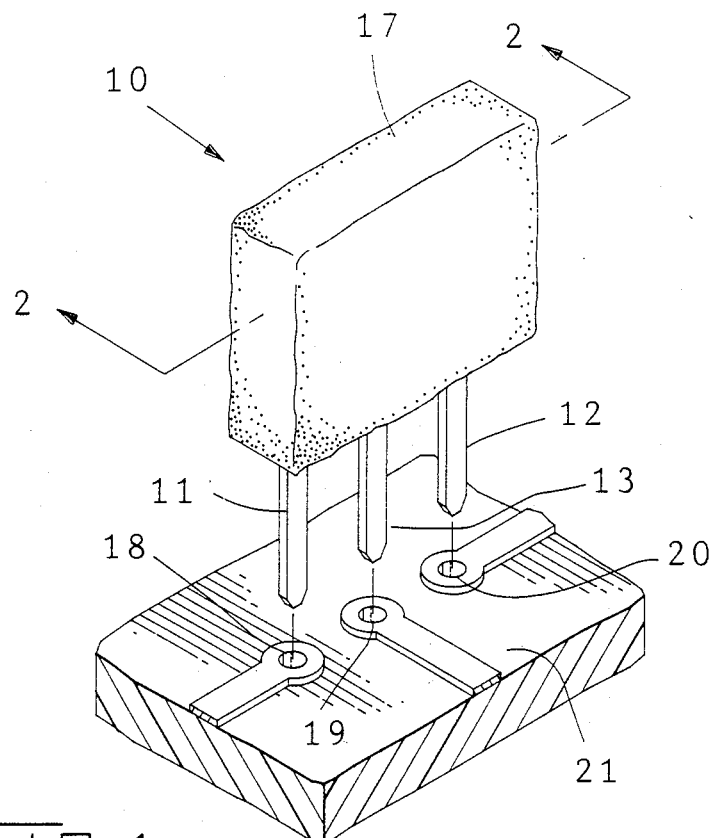
FIG. 1 is a perspective view of the improved filter assembly of the present invention, shown in exploded relationship to a portion of a printed circuit ("PC") board.
Figure 2:
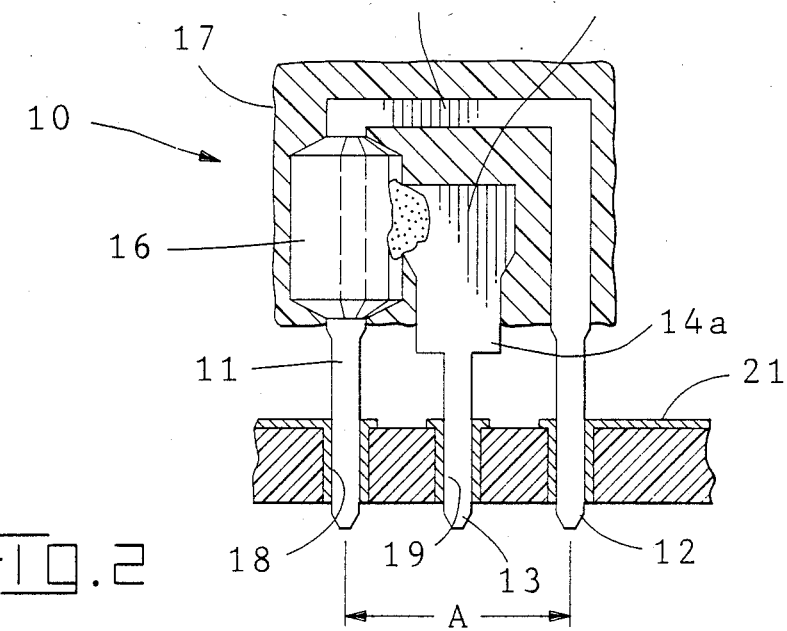
FIG. 2 is a cross-sectional view of the improved filter assembly and the PC board, taken along the lines 2—2 of FIG. 1.
Figure 1A:
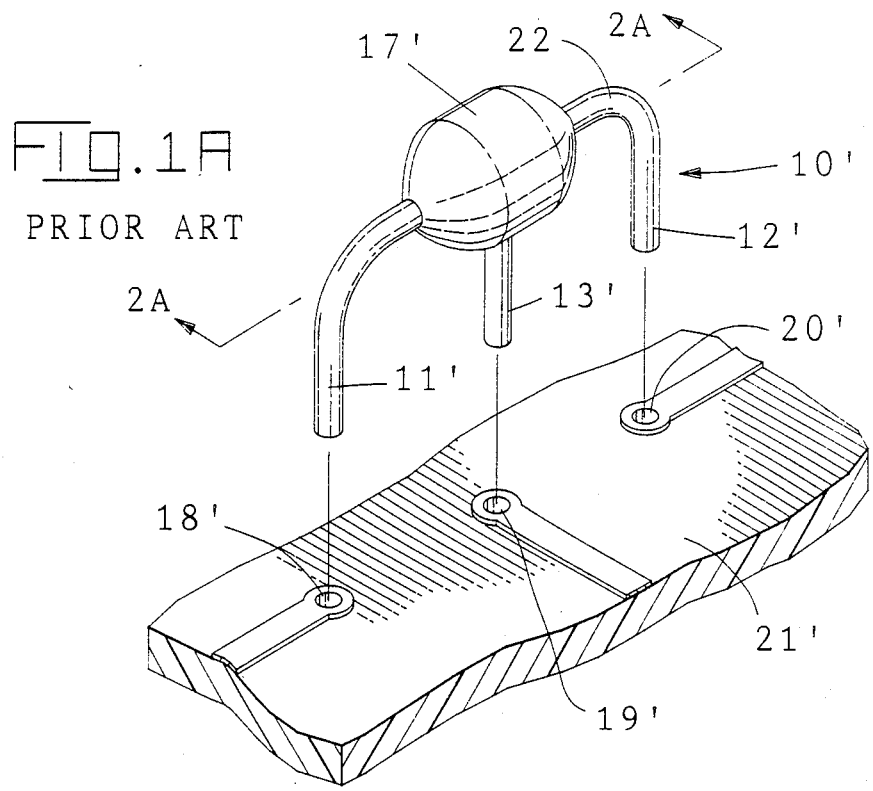
FIG. 1A is a perspective view of a prior art filter assembly, shown in exploded relationship to the PC board.
Figure 2A:
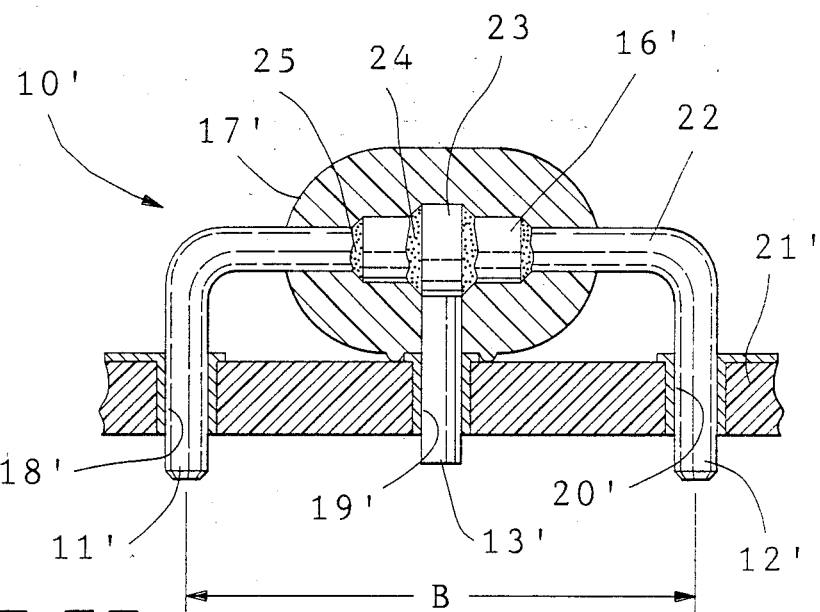
FIG. 2A is a cross-sectional view of the prior art filter assembly and the PC board, taken along the lines 2A—2A of FIG. 1A.
Figure 3:
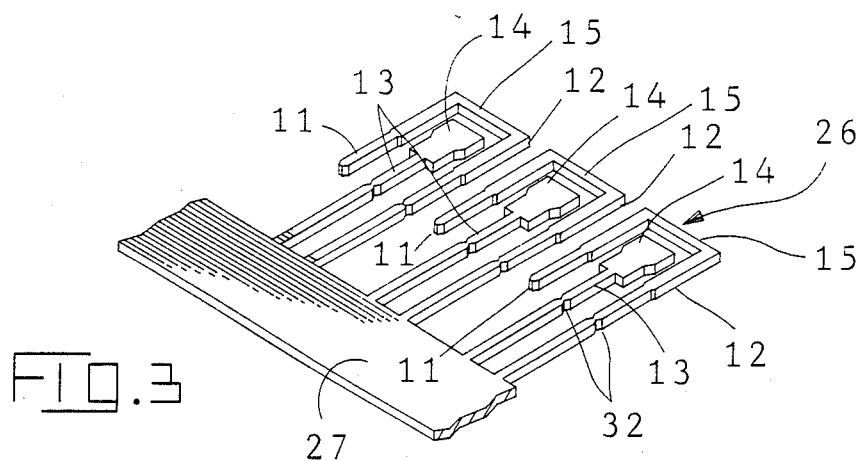
FIG. 3 is a perspective view of a blanked-out strip, showing the initial step in the improved method of manufacture of the filter assembly of the present invention.
Figure 4:
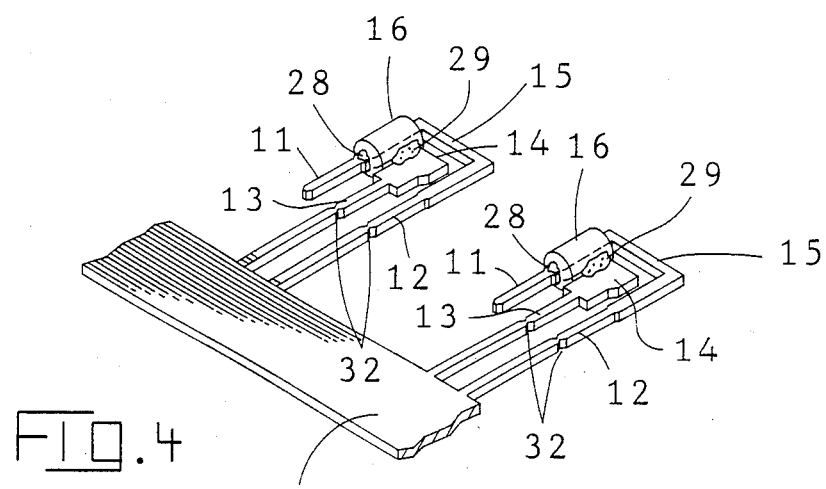
FIG. 4 corresponds substantially to that of FIG. 3, but illustrates the further step of slidably positioning a cylindrical filter sleeve on one of the outer legs of the filter assembly, and thereafter soldering the filter sleeve to the one outer leg and to the enlarged blade portion on the inner ground leg, respectively.
Figure 5:
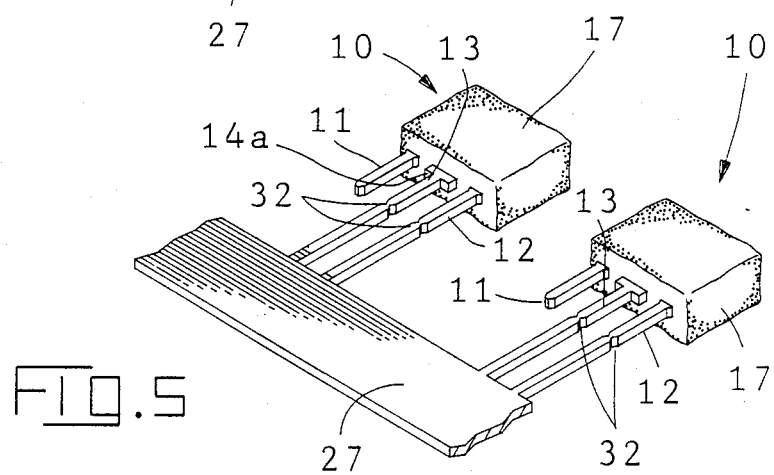
FIG. 5 illustrates the still further step of encapsulating the filter sleeve, bight portion connecting the outer legs, and respective portions of the outer legs and the inner ground leg shown in FIG. 4 to form the filter assembly.

With reference to FIGS. 1 and 2, and with further reference to FIGS. 1A and 2A, the compactness and advantages of the filter assembly of the present invention may be more readily appreciated in comparison to the prior art structure.

In FIGS. 1 and 2, the improved filter assembly 10 of the present invention has a plurality of legs including a pair of outer legs 11 and 12 and an inner leg 13 disposed therebetween and, preferably, centrally of the outer legs 11 and 12, respectively. The outer legs 11 and 12 comprise the conductor legs of the filter assembly, while the inner leg 13 comprises the ground pin of the filter assembly. Preferably, the inner ground leg 13 has an enlarged blade portion 14, and the respective outer legs 11 and 12 are connected by a bight portion 15 of the filter assembly. In this embodiment, the filter sleeve 16 is carried by the one outer leg 11. The filter sleeves are of the type having an inner conductor and an outer ground conductor. Preferably, but not necessarily, the filter sleeve 16 is that described and claimed in the aforesaid U.S. Pat. No. Re. 29,258, and the filter sleeve 16 is suitably secured mechanically and electrically, as hereinafter described. Moreover, the filter sleeve 16, bight portion 15, and respective portions of the legs 11-13 are suitably encapsulated by an insulating means 17, as hereinafter described. The respective legs 11-13 of the filter assembly depend from the insulating means 17, are substantially parallel to one another, and are adapted to be received within corresponding apertures 18, 19 and 20, respectively, formed in the printed circuit board 21.

With this arrangement, the filter sleeve 16 is substantially parallel to the respective legs 11-13, rather than perpendicular thereto; and this structural arrangement facilitates a substantially-compact improved filter assembly 10. In this regard, it will be appreciated that the controlling dimension is the distance between the respective outer legs 11 and 12 (designated at A in FIG. 2). This distance may be varied in accordance with the circuit pattern on the circuit board to which the assembly is to be attached.

In comparison, and with reference to FIGS. 1A and 2A, the prior art filter assembly 10' employs a filter sleeve 16' disposed perpendicularly to its legs 11', 12' and 13', respectively. The filter sleeve 16' is mounted on a conductor wire 22, the ends of which are bent at right angles thereto to form the respective outer depending legs 11' and 12'. The ground leg 13' is formed integrally with an eyelet 23 received over the filter sleeve 16'. The eyelet 23 is secured to the filter sleeve 16' by solder 24, and the filter sleeve 16' is secured to the conductor wire 22 by solder 25. The legs 11', 12' and 13' of the filter assembly 10' are received within apertures 19', 20' and 21', respectively, of the PC board 21'. Accordingly, the distance between the respective outer legs 11' and 12' (designated at B in FIG. 2A) is substantially greater than the corresponding dimension A between the outer legs 11 and 12, as shown in FIG. 2; and as a result, a substantially more compact filter assembly 10 is provided, consonant with the teachings of the present invention, thereby facilitating the miniaturization of the PC board 21 (or boards) used extensively in electronic equipment.

Moreover, the present invention provides a substantially improved method of manufacture of the filter assembly 10. With this improved method, the respective filter assemblies are formed on a continuous ribbon or strip (or else held together by a suitable coiled carrier) for substantially reduced manufacturing costs, while allowing an individual filter assembly to be broken off (or cut off) for user convenience.

More specifically, and with reference to FIGS. 3-6, the respective spaced-apart filter assembly segments 26 are stamped out (or blanked out) of a metallic strip 27 (made of a copper alloy or other suitable material). Each of the segments 26 includes outer legs 11 and 12 and a central inner leg 13, the latter being provided with an enlarged blade portion 14. The one outer leg 11 is shorter than the other outer leg 12, that is, not connected to the strip 27. The filter sleeve 16 is slidably received over the one (shorter) outer leg 11 and has one end thereof disposed substantially adjacent to the bight portion 15. The filter sleeve 16 may be manually or automatically received over the outer leg 11, as will be appreciated by those skilled in the art. A solder ring 28 is disposed between the bore in the filter sleeve 16 and the one outer leg 11, and a solder paste 29 is disposed between the external cylindrical surface of the filter sleeve 16 and the blade portion 14 on the ground leg 13. The soldering operation (or its equivalent) secures the filter sleeve 16 to the outer leg 11 and to the ground leg 13, respectively, in mechanical and electrical engagement therewith; and the cylindrical filter sleeve 16 is disposed substantially parallel to the respective legs 11-13 (and not at right angles thereto, as in the prior art) thereby contributing to the substantial compactness of the filter assembly 10, as herein described. Thereafter, each filter assembly 10 is encapsulated with an insulating means 17. One such insulating means or material (suitable for this purpose) is "DUREZ" supplied by Hooker Chemical Company. The encapsulation may constitute a dipping process into a bath of the insulating material or other suitable processes as known in the art, such as insert molding and the like.

Preferably, blade portion 14 extends from the end of the ground leg near bight portion 15 and downwardly along the leg beyond that portion of the ground leg that is to be encapsulated, thus providing standoff 14a for the filter assembly. Standoff 14a provides space between the filter assembly and the board for soldering and subsequent cleaning operations when the assembly is mounted to a board, as best seen in FIG. 2.

With reference to FIG. 7, a first alternate embodiment is illustrated wherein only the ground leg 13 is carried by the strip 27, and wherein each of the outer legs 11 and 12, respectively, is not connected to the strip 27. Accordingly, a filter sleeve 16 is carried on each of the outer legs 11 and 12 to form a cascade arrangement.

Preferably this embodiment is assembled by first securing a first filter sleeve 16 to outer leg 11 in the manner previously described, then severing outer leg 12 from the strip and securing a second filter sleeve 16 to leg 12 in the manner previously described.

With reference to FIG. 8, a second alternate embodiment is illustrated wherein the filter sleeves 16 carried on each of the outer legs 11 and 12 are of the type known as ferrite beads or sleeves, and a capacitor 31 is disposed between the blade portion 14 and the bight portion 15 of the filter assembly 10. Preferably, capacitor 30 is a surface mountable chip capacitor having plated surfaces 30.

Figure 9:
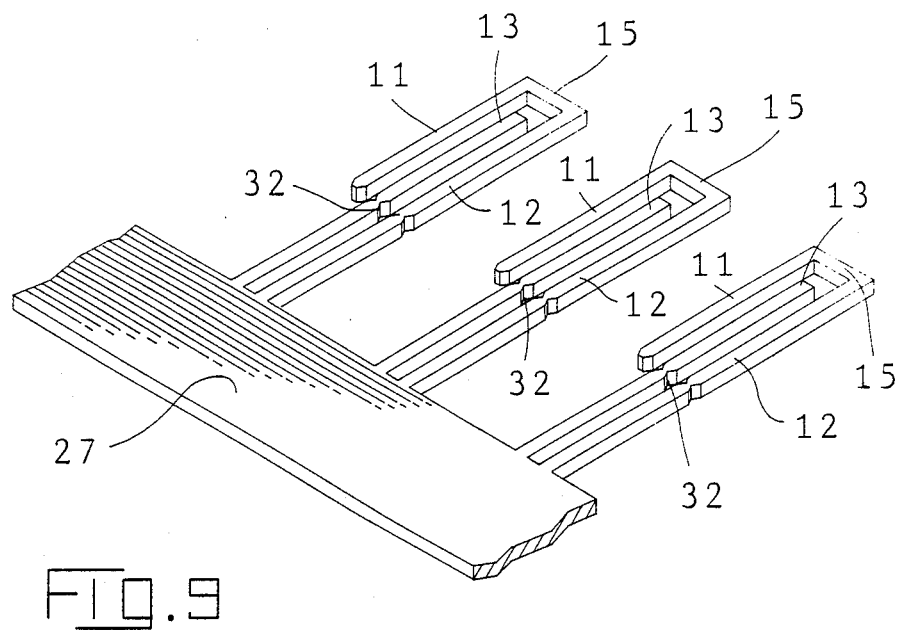
FIG. 9 is a perspective view of a further embodiment of the strip from which the present invention is manufactured.
Figure 10:
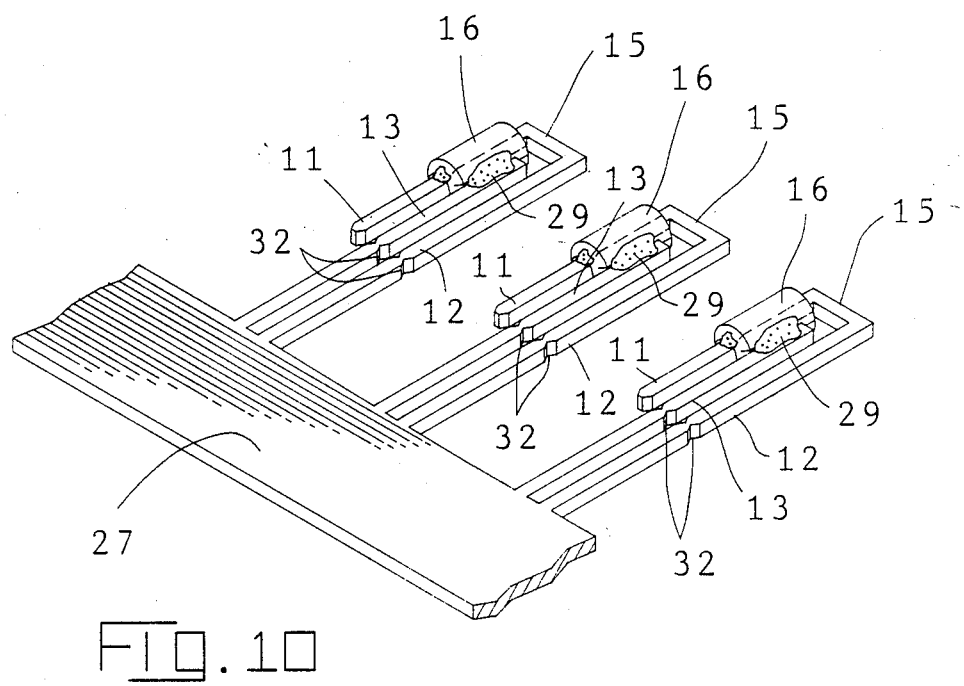
FIG. 10 is a further perspective view, corresponding substantially to that of FIG. 9, but showing the positioning and securing of the filter sleeves on the respective filter assembly segments on the continuous strip.
Figure 11:
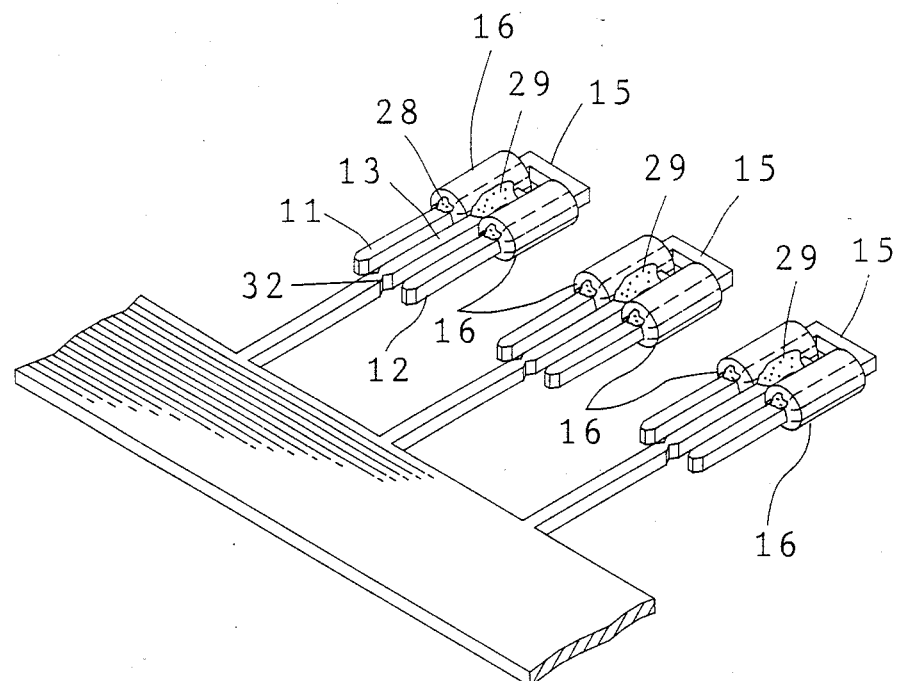
FIG. 11 is a view similar to FIG. 10, showing a cascaded filter assembly using the embodiment of FIG. 9.
Figure 12:
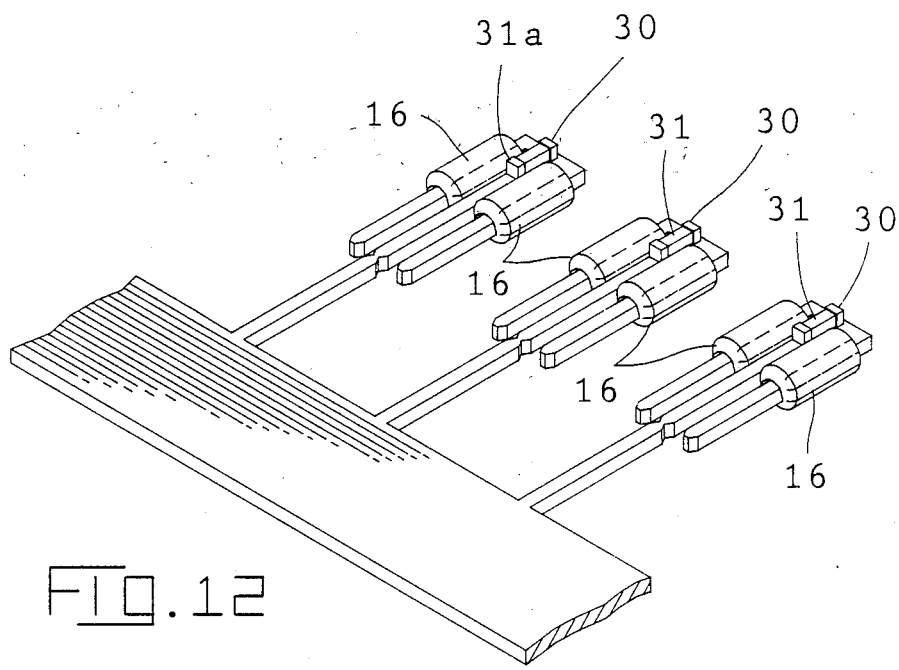
FIG. 12 is a view similar to FIG. 10, showing a T-filter assembly using the embodiment of FIG. 9.

With reference to FIGS. 9 and 10, a third alternate embodiment is illustrated, wherein the blade portion 14 is omitted from the ground leg 13, thereby further reducing the spacing between the outer legs 11 and 12, and thereby further improving the compactness and miniaturization of the filter assembly 10 of the present invention. FIGS. 11 and 12 show alternative cascaded and T-filter assemblies made in the same manner as previously described.

With these arrangements, the improved filter assemblies 10 of the present invention may be carried on the strip 27; and certain lengths of such strips 27 may be sold to individual customers or users. Whenever desired, the user may break off a filter assembly 10 from the strip 27; and for this purpose, notches 32 are formed in the respective legs which are connected to the strip 27.

With reference to FIGS. 13 and 14, a fourth alternate embodiment is illustrated, wherein the respective spaced-apart filter assembly segments 26A are formed from a continuous wire 33 (rather than being stamped, as in the previous embodiments of FIGS. 3-10). The wire 33 is suitably bent to form the respective legs 11, 12 and 13. The outer legs 11 and 12 are connected by a bight 15, while the outer leg 12 and ground leg 13 are connected by a bight 34 disposed oppositely of the bight 15. The outer leg 12 and ground leg 13 are mounted on a carrier strip or ribbon 35 of paper, plastic or other suitable material. With this arrangement, the ribbon 35 may be coiled up; and the respective wire-formed filter assemblies 10A are simply cut off the coil, as desired. Preferably, the inner ground leg 13 has a substantially-parallel offset tang 36 bent outwardly towards the shorter outer leg 11, as shown more clearly in FIG. 13, the purpose of which is similar to the blade portion 14 of the previous embodiments. Thus, and as shown more closely in FIG. 14, the filter sleeve 16 is soldered to the offset tang 36.

Accordingly, it will be appreciated by those skilled in the art that the improved filter sleeves of the present invention provide both compactness and miniaturization while facilitating low-cost production and automated assembly methods.

Obviously, many modifications may be made without departing from the basic spirit of the present invention. Accordingly, it will be appreciated by those skilled in the art that within the scope of the appended claims, the invention may be practiced other than has been specifically described herein.

What is claimed is:

1. A filter assembly of the type having a single filter sleeve for providing RFI/EMI filtering on a printed circuit board, comprising three legs disposed substantially parallel to each other and including a first outer leg, a second outer leg, the first and second outer legs being joined by a bight portion, and a central leg disposed between the first and second outer legs, wherein the outer legs comprise the respective conductors of the filter assembly, and wherein the central leg comprises a ground pin of the filter assembly; a substantially cylindrical filter sleeve received over and mechanically secured and electrically engaged with one of the outer legs, such that the filter sleeve is disposed substantially parallel to the legs of the filter assembly and has an outer side surface closely adjacent a side surface of said central leg, said outer side surface being electrically engaged with said central leg by means of conductive joining material, and insulating material encapsulating the filter sleeve, bight portion and respective portions of the legs, whereby the spacing between the outer and central leg is minimized and the filter assembly is substantially compact.

2. The filter assembly of claim 1 wherein said side surface of said central leg is along a widened portion of said central leg.

3. The filter assembly of claim 2 wherein said central leg is symmetrical from side to side whereby said filter sleeve can be placed on either of said outer legs and said central leg has a second like side surface opposed from said side surface for electrical engagement with said filter sleeve.

4. The method of making a strip of respective filter assemblies, comprising the steps of: providing a ribbon of metal, blanking out the ribbon to form a plurality of respective spaced-apart filter assembly segments, wherein each segment includes a pair of substantially-parallel outer legs, a bight portion connecting the respective outer legs, such that the respective outer legs comprise the conductors of the filter assembly, and a central ground leg disposed between the respective outer legs and substantially parallel thereto, providing a filter sleeve and slidably receiving the filter sleeve over one of the outer legs to a position substantially adjacent to the bight portion, such that the filter sleeve is substantially parallel to the respective legs, securing the filter sleeve in mechanical and electrical engagement with the one outer leg and with the central ground leg, respectively, and encapsulating the filter sleeve, bight portion, and respective portions of the legs with an insulating means.

5. The method of claim 4, wherein the filter sleeve is soldered to the one outer leg and to the central ground leg, respectively.

6. The method of claim 5, further including the step of providing an enlarged blade portion on the central ground leg, and soldering the filter sleeve to the enlarged blade portion of the central ground leg.

7. The method of claim 4, further including the step of providing a carrier strip for the respective filter assembly segments, wherein the one outer leg is separated from the carrier strip, and wherein the other outer leg and the central ground leg are integrally connected to the carrier strip, and forming notches on the other outer leg and on the central ground leg, respectively, intermediately of the carrier strip and the encapsulating insulating means, whereby the respective filter assemblies may be broken off from the strip, as desired.

8. The method of making a strip of respective filter assemblies, each of which may be cut off as desired, comprising the steps of: providing a continuous wire and bending the wire to form a plurality of respective spaced-apart filter assembly segments, wherein each segment includes a pair of substantially-parallel outer legs, a first bight portion connecting the respective outer legs, such that the respective outer legs comprise the conductors of the filter assembly, and a central ground leg disposed between the respective outer legs and substantially parallel thereto, providing a filter sleeve and slidably receiving the filter sleeve over one of the outer legs to a position substantially adjacent to the bight portion, and securing the filter sleeve to the one outer leg and to the central ground leg, respectively, in mechanical and electrical engagement therewith, and encapsulating the filter sleeve, first bight portion, and respective portions of the legs.

9. The method of claim 8, further including the step of bending an offset tang on the central ground leg, substantially parallel to the one outer leg and closely disposed thereto, such that the filter sleeve is slidably received on the one outer leg, and such that the filter sleeve has an outer cylindrical surface in substantial engagement with the offset tang on the central ground leg.

10. The method of claim 9, wherein the filter sleeve is soldered to the outer leg and to the offset tang, respectively.

11. The method of claim 8, further including the steps of bending the continuous wire to form a second bight portion, providing a carrier strip, and joining the carrier strip to the segments between the respective bight portions.

12. The method of making a strip of respective filter assemblies, each of which may be cut off as desired, comprising the steps of: providing a continuous wire and bending the wire to form a plurality of respective spaced-apart filter assembly segments, wherein each segment includes a pair of substantially-parallel outer legs, a first bight portion connecting the respective outer legs, such that the respective outer legs comprise the conductors of the filter assembly, and a central ground leg disposed between the respective outer legs and substantially parallel thereto, bending the ground leg to provide an offset tang thereon, further bending the wire to form a second bight portion, providing a carrier strip and joining the carrier strip between the respective bight portions of the filter assembly segments, providing a filter sleeve and slidably receiving the filter sleeve over one of the outer legs to a position substantially adjacent to the bight portion, soldering the filter sleeve to the one outer leg and to the offset tang on the ground leg, respectively, in mechanical and electrical engagement therewith, and encapsulating the filter sleeve, first bight portion, and respective portions of the legs.

* * * * *